(12) United States Patent
Hong et al.

(10) Patent No.: US 10,680,087 B2
(45) Date of Patent: Jun. 9, 2020

(54) GATED DIODE HAVING FINGERS WITH ELEVATED GATES

(71) Applicant: NXP B.V., Eindhoven (NL)

(72) Inventors: Cheong Min Hong, Singapore (SG); Chunshan Yin, Singapore (SG); Yu Chen, Singapore (SG)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/122,841

(22) Filed: Sep. 5, 2018

(65) Prior Publication Data

US 2020/0075751 A1    Mar. 5, 2020

(51) Int. Cl.
    *H01L 29/739*    (2006.01)
    *H01L 29/66*     (2006.01)
    *H01L 27/02*     (2006.01)

(52) U.S. Cl.
    CPC ...... *H01L 29/7391* (2013.01); *H01L 27/0255* (2013.01); *H01L 29/66356* (2013.01)

(58) Field of Classification Search
    CPC ........... H03F 2200/183; H01L 29/7391; H01L 27/0255; H01L 29/66356
    See application file for complete search history.

(56) References Cited

U.S. PATENT DOCUMENTS

| | | |
|---|---|---|
| 7,884,411 B2 | 2/2011 | Chang et al. |
| 8,143,680 B2 | 3/2012 | Lin et al. |
| 9,117,669 B2 * | 8/2015 | Lin ..................... H01L 27/0255 |
| 2004/0188705 A1 | 9/2004 | Yeo et al. |
| 2013/0153916 A1 | 6/2013 | Weyers et al. |
| 2018/0040605 A1 * | 2/2018 | Zhou ................. H01L 21/76895 |

FOREIGN PATENT DOCUMENTS

| | | |
|---|---|---|
| EP | 0140772 | 7/1988 |
| WO | 2018111220 A1 | 6/2018 |

OTHER PUBLICATIONS

Yang, M., "BSIM4-Based Lateral Diode Model for LNA Co-Designed with ESD Protection Circuit". 11th Int'l Symposium on Quality Electronic Design, IEEE 2010.

* cited by examiner

*Primary Examiner* — Hsien Ming Lee

(57) ABSTRACT

An integrated circuit has a first gated diode with one or more diode fingers. Each diode finger has an elevated gate, an underlying p-type diffusion, and an underlying n-type diffusion. Each diffusion has a base region and an annular side region located between the base region and the elevated gate such that the diffusions have increased lateral surface areas that support greater current levels for the diode finger, which enables gated diodes to be implemented with fewer fingers and therefore less layout area than equivalent conventional gated diodes that do not have elevated gates. The first gated diode can be implemented with an analogous second gated diode to form ESD-protection circuitry for the integrated circuit.

3 Claims, 6 Drawing Sheets

GATED DIODE HAVING FINGERS WITH ELEVATED GATES

BACKGROUND

The present invention relates to integrated circuits (IC) and, more particularly, to IC diodes, such as those used for electro-static discharge (ESD) protection.

An integrated circuit is fabricated by selectively adding material to and removing material from a semiconductor substrate in a sequence of fabrication steps. For example, p (positive) or n (negative) doped well regions are formed on a substrate by masking regions that are to remain undoped and then applying an appropriate p- or n-type dopant material to form p/n wells in the remaining unmasked regions. During such a fabrication step, the p/n wells will all be formed to have the same thickness (aka depth), which thickness is dictated by the requirements of the desired integrated circuitry.

One known type of integrated circuitry is ESD-protection circuitry, which is designed to protect other circuitry formed on the same substrate from electro-static discharge (ESD) events during which an over voltage (e.g., a voltage sufficiently higher than the IC high supply voltage VDD) or an under voltage (e.g., a voltage sufficiently lower than the IC low supply voltage VSS) is applied to an input/output (I/O) port (aka I/O pin or I/O pad) of the IC.

FIG. 1 is a schematic circuit diagram of one known type of ESD-protection circuitry 100 configured to protect other (i.e., protected) circuitry 120 from ESD events at an I/O pin 130. As shown in FIG. 1, the ESD-protection circuitry 100 has a first diode 112 connected between VSS and the I/O pin 130 and a second diode 114 connected between the I/O pin 130 and VDD. During normal operations in which the voltage level applied to the I/O pin 130 remains at or above the low supply voltage level VSS and at or below the high supply voltage level VDD, neither the first diode 112 nor the second diode 114 will conduct current.

If and when, however, the voltage level applied to the I/O pin 130 begins to fall below VSS by one diode voltage drop (~0.7V), current will begin to flow through the first diode 112 from VSS to the I/O pin 130, thereby limiting the magnitude of the under voltage condition at the I/O pin 130 and preventing an undesirably large under voltage from being applied to the protected circuitry 120. Similarly, if and when the voltage level applied to the I/O pin 130 begins to exceed VDD by one diode voltage drop (~0.7V), current will begin to flow through the second diode 114 from the I/O pin 130 to VDD, thereby limiting the magnitude of the over voltage condition at the I/O pin 130 and preventing an undesirably large over voltage from being applied to the protected circuitry 120. In order to provide adequate ESD protection to the protected circuitry 120, the diodes 112 and 114 must be designed and configured to rapidly shunt sufficiently large amounts of current away from the I/O pin 130.

FIG. 2 is a cross-sectional side view of the region of a semiconductor substrate 202 corresponding to a conventional N+/isolated P well gated diode 200 that can be used to implement the first diode 112 of FIG. 1. Those skilled in the art will understand that an analogous P+/N well gated diode can be used to implement the second diode 114 of FIG. 1.

As represented in FIG. 2, the gated diode 200 has six diode fingers 210(1)-210(6), each comprising a dielectric gate 212 above and separating a P+ diffusion 214 from an adjacent N+ diffusion 216. Note that, except for the outermost P+ diffusion 214(1) and 214(4), each of the P+ and N+ diffusions 214 and 216 is shared by two adjacent fingers 210. For example, the N+ diffusion 216(1) is shared by the fingers 210(1) and 210(2), the P+ diffusion 214(2) is shared by the fingers 210(2) and 210(3), and so on.

As represented in FIG. 2, each P+ diffusion 214 is connected by way of a corresponding conducting (e.g., metal) contact 218 to VSS, and each N+ diffusion 216 is connected by way of a corresponding contact 218 to a corresponding I/O pin (e.g., the I/O pin 130 of FIG. 1). Although not shown in FIG. 2, each gate 212 is connected to its corresponding P+ diffusion 214. Thus, the gate 212(1) is connected to the P+ diffusion 214(1), the gates 212(2) and 212(3) are both connected to the shared P+ diffusion 214(2), the gates 212(4) and 212(5) are both connected to the shared P+ diffusion 214(3), and the gate 212(6) is connected to the P+ diffusion 214(4).

If and when the voltage applied to the I/O pin begins to fall below VSS by one diode voltage drop (~0.7V), current will begin to flow from the P+ diffusions 214 to the N+ diffusions 216, as represented by the horizontal arrows in FIG. 2. The magnitude of the maximum current that can flow within the gated diode 200 is a function of, among other things, the number of fingers 210 in the gated diode 200 and the lateral surface area of the side walls of each of the P+ and N+ diffusions 214 and 216. The lateral surface area of each diffusion is a function of the thickness of the diffusions.

In typical IC fabrication procedures, a single fabrication step is used to form a number of P+ diffusions on the semiconductor substrate such that all of those P+ diffusions have the same thickness. Similarly, another fabrication step is used to form a number of N+ diffusions on the semiconductor substrate such that all of those N+ diffusions have the same thickness, which is typically but not necessarily the same as the thickness of the P+ diffusions.

In a typical IC, the thickness of the N+ and P+ diffusions in a gated diode, such as the gated diode 200 of FIG. 2, is dictated by the requirements of other (i.e., non-ESD-protection) circuitry formed on the same semiconductor substrate. As such, since the thickness of the P+ and N+ diffusions is fixed by those other requirements, in order to enable a gated diode having the architecture of the gated diode 200 to support a sufficient amount of current for ESD protection, the gated diode must be designed with a sufficient number of fingers, with larger maximum current levels requiring more fingers and therefore larger footprints on the semiconductor substrate for those gated diodes.

It would be advantageous to have a gated diode for ESD protection devices that does not require an excessive amount of substrate real estate.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION

One aspect of the present invention is an integrated circuit comprising a first gated diode comprising one or more diode fingers, each diode finger comprising an elevated gate and a p-type diffusion and an n-type diffusion on opposing sides of the elevated gate. The p-type diffusion comprises a p-type base region and a p-type annular side region between the p-type base region and the elevated gate, and the n-type diffusion comprises an n-type base region and an n-type annular side region between the n-type base region and the elevated gate.

Another aspect of the present invention is a method for fabricating a first gated diode of an integrated circuit. One or more diode fingers of the first gated diode are formed on a substrate, each diode finger comprising an elevated gate and a p-type diffusion and an n-type diffusion on opposing sides of the elevated gate. The p-type diffusion comprises a p-type base region and a p-type annular side region between the p-type base region and the elevated gate, and the n-type diffusion comprises an n-type base region and an n-type annular side region between the n-type base region and the elevated gate. At least one contact is formed connected to each of the elevated gate, the p-type diffusion, and the n-type diffusion of each diode finger of the first gated diode.

It is typically desirable to limit the footprint of integrated circuitry formed on semiconductor substrates. As such, it is desirable to design and configure gated diodes, such as those used in ESD circuitry such as the ESD-protection circuitry 100 of FIG. 1, with relatively small footprints while still supporting sufficiently high current levels for ESD protection.

It is also typically desirable to limit the number of different fabrication steps performed in fabricating integrated circuitry. As such, it is desirable to form the P+ and N+ diffusions of gated diodes in ESD-protection circuitry during the same fabrication steps used to form other P+ and N+ diffusions in other circuitry on the same semiconductor substrate.

Figure 3:
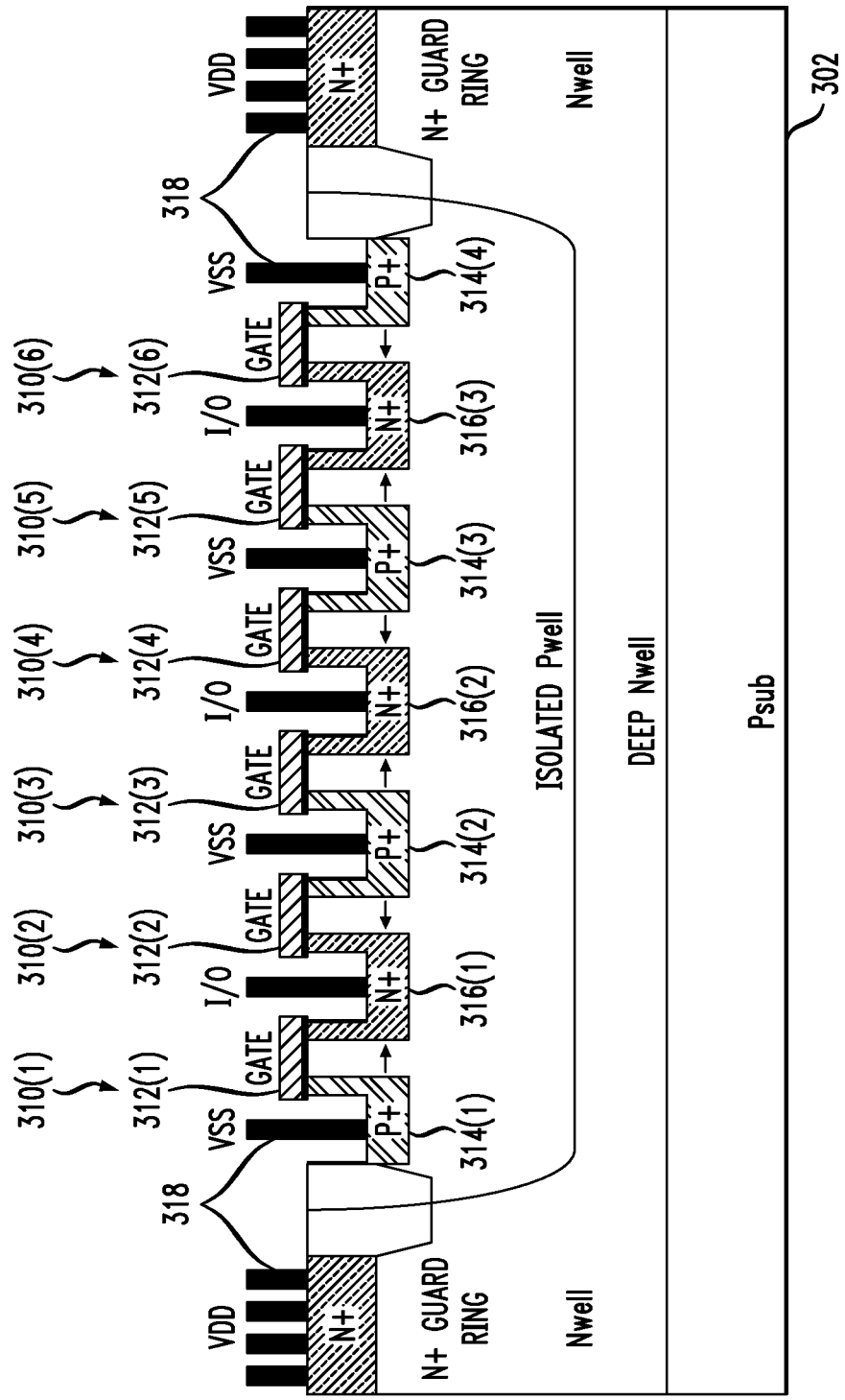
FIG. 3 is a cross-sectional side view of the region of a semiconductor substrate corresponding to an N+/isolated P well gated diode according to one embodiment of the present invention.

FIG. 3 is a cross-sectional side view of a region of a semiconductor substrate 302 corresponding to an N+/isolated. Pwell gated diode 300 that can be used to implement the first diode 112 of FIG. 1, according to one embodiment of the present invention. Those skilled in the art will understand that an analogous P+/N well gated diode can be used to implement the second diode 114 of FIG. 1.

As represented in FIG. 3, the gated diode 300 has six diode fingers 310(1)-310(6), each comprising a dielectric gate 312 above and separating a P+ diffusion 314 from an adjacent N+ diffusion 316. Note that, except for the outermost P+ diffusions 314(1) and 314(4), each of the P+ and N+ diffusions 314 and 316 is shared by two adjacent fingers 310. For example, the N+ diffusion 316(1) is shared by the fingers 310(1) and 310(2), the P+ diffusion 314(2) is shared by the fingers 310(2) and 310(3), and so on.

Figure 1:
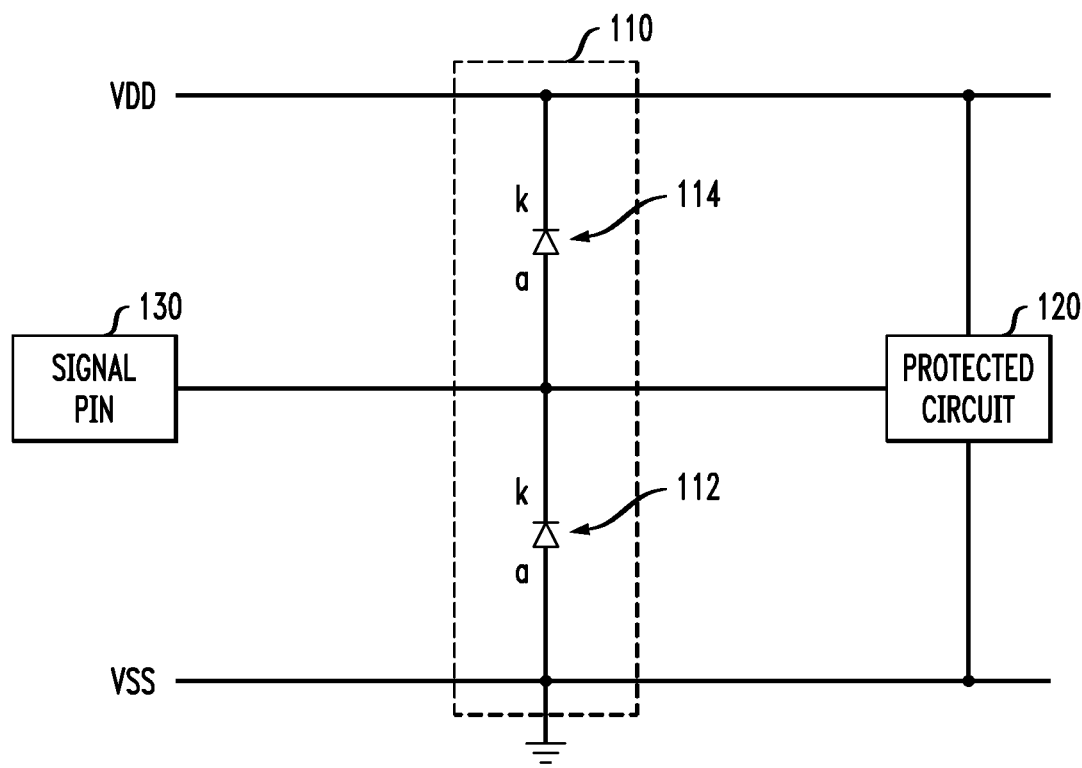
FIG. 1 is a schematic circuit diagram of one known type of ESD-protection circuitry.

Each P+ diffusion 314 is connected by way of a corresponding conducting (e.g., metal) contact 318 to VSS, and each N+ diffusion 316 is connected by way of a corresponding contact 318 to a corresponding I/O pin (e.g., the I/O pin 130 of FIG. 1). Although not shown in FIG. 3, each gate 312 is connected to its corresponding P+ diffusion 314, for example, by a trace in metal layer M1. Thus, the gate 312(1) is connected to the P+ diffusion 314(1), the gates 312(2) and 312(3) are both connected to the shared P+ diffusion 314(2), the gates 312(4) and 312(5) are both connected to the shared P+ diffusion 314(3), and the gate 312(6) is connected to the P+ diffusion 314(4).

If and when the voltage applied to the I/O pin begins to fall below VSS by one diode voltage drop (~0.7V), current will begin to flow from the P+ diffusions 314 to the N+ diffusions 316, as represented by the horizontal arrows in FIG. 3. The magnitude of the current that can flow within the gated diode 300 is a function of, among other things, the number of fingers 310 in the gated diode 300 and the lateral surface area of the side walls of each of the P+ and N+ diffusions 314 and 316.

Figure 4:
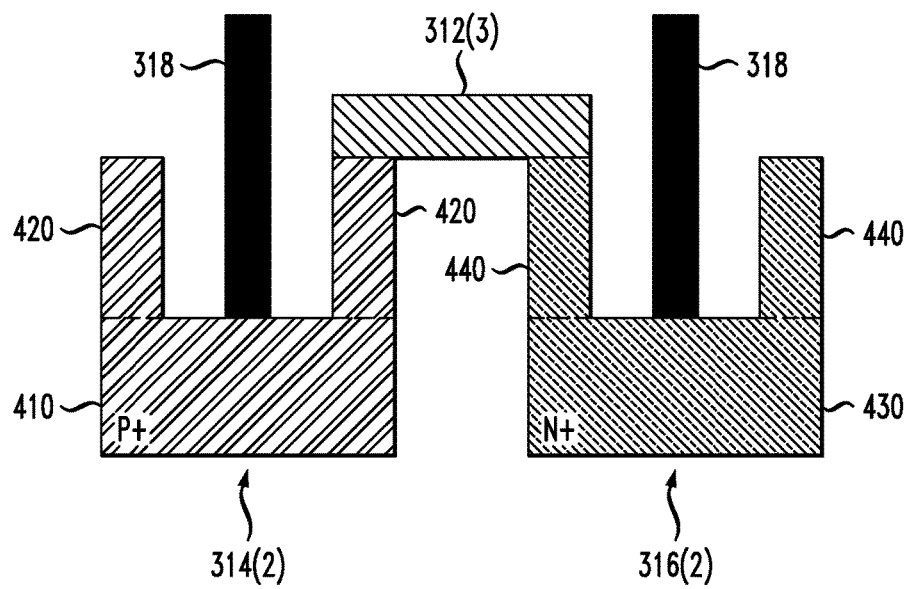
FIG. 4 is an expanded cross-sectional side view of one diode finger of FIG. 3.

FIG. 4 is an expanded cross-sectional side view of the diode finger 310(3) of FIG. 3, which includes the gate 312(3), the P+ diffusion 314(2), and the N+ diffusion 316(2). The P+ diffusion 314(2) has a lower base region 410 having a thickness T1 and an annular upper side region 420 having a height T2. Similarly, the N+ diffusion 316(2) has a lower base region 430 having the thickness T1 and an annular upper side region 440 having the height T2. Note that, in other embodiments, the thicknesses of the two base regions 410 and 430 need not be the same and/or the heights of the two annular side regions 420 and 440 need not be the same.

The gate 312(3) is elevated above the base regions 410 and 430 due to the presence of the intervening annular side regions 420 and 440. The same is true for each gate 312 in the gated diode 300 of FIG. 3. As such, the gates 312 of FIG. 3 are referred to herein as "elevated gates." This is different from the architecture of the conventional circuit shown in FIG. 2 in which there are no annular side regions, and the bottoms of the gates 212 substantially coincide with the tops of the P+ and N+ diffusions 214 and 216. The gates 212 of FIG. 2 are not elevated gates as that term is used herein.

As described further below, in the presently preferred embodiment, the thickness T1 of the base regions 410 and 430 is the same as the thickness of the P+ and N+ diffusions in the other, non-ESD-protection circuitry formed on the same semiconductor substrate during the same fabrication steps. Significantly, the thickness T1 of the base regions 410 and 430 is typically dictated by the thickness requirements for those other P+ and N+ diffusions. However, the height T2 of the side regions 420 and 440 is not directly dependent on the thickness requirements for those other P+ and N+ diffusions (although the maximum possible value for the height T2 will be limited by other characteristics of the integrated circuitry, such as the thickness of the underlying isolated P well in which the P+ and N+ diffusions are formed).

Figure 2:
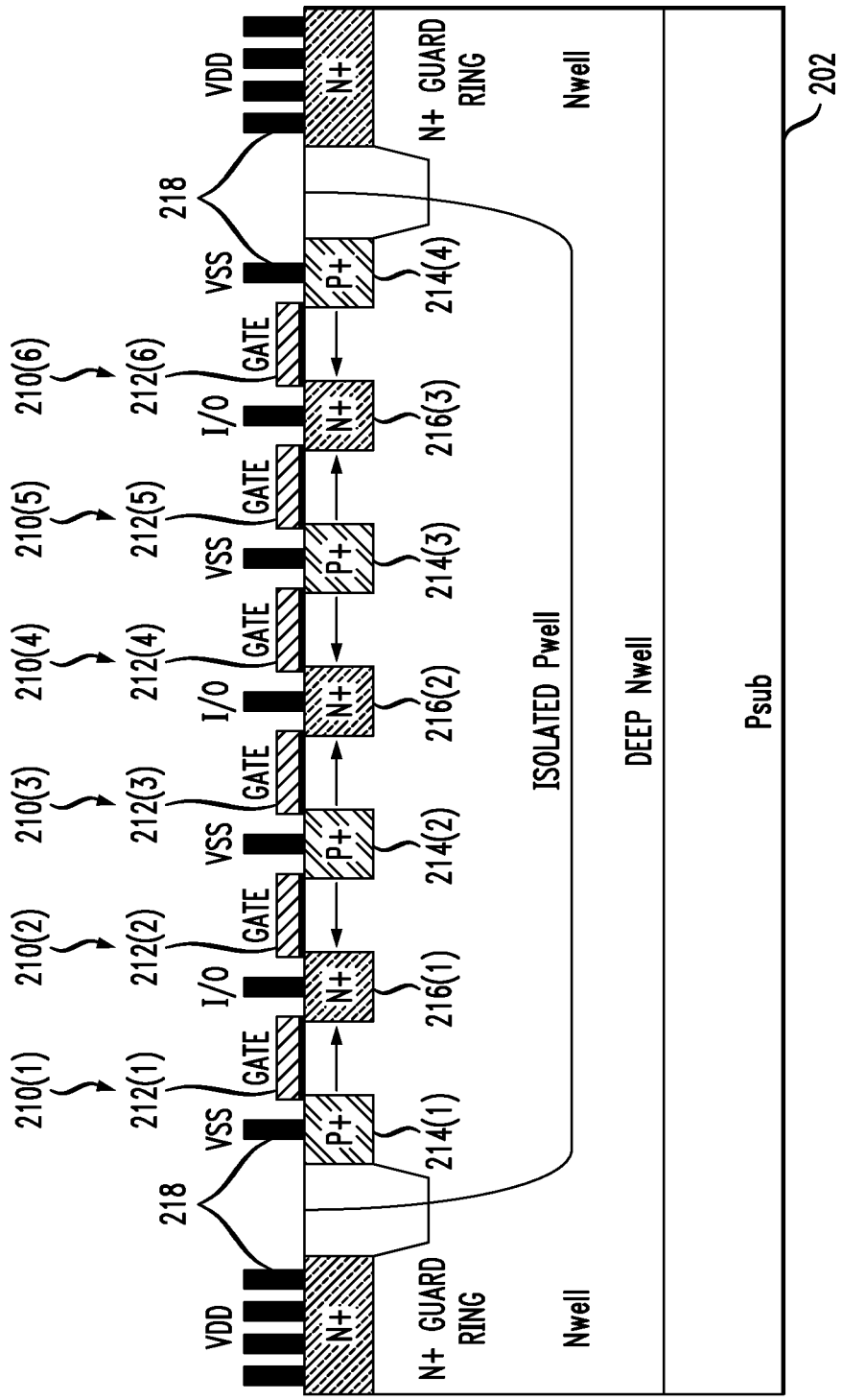
FIG. 2 is a cross-sectional side view of a region of a semiconductor substrate corresponding to a conventional N+/isolated P well gated diode.

Thus, for integrated circuitry having the same diffusion-thickness requirements as for the integrated circuitry of FIG. 2, the lateral surface area of each of the P+ and N+ diffusions 314 and 316 of FIGS. 3 and 4 will be larger than the lateral surface area of each of the P+ and N+ diffusions 214 and 216 of FIG. 2 due to the existence of the annular side regions 420 and 440 in the diffusions 314 and 316 of FIGS. 3 and 4. In particular, the lateral surface area of each base region 410 and 430 will be substantially equivalent to the lateral surface area of each of the P+ and N+ diffusions 214 and 216 of FIG.

2. As such, due to the presence of the annular side regions 420 and 440, the total lateral surface area of each of the P+ and N+ diffusions 314 and 316 will be larger than the total lateral surface area of each of the P+ and N+ diffusions 214 and 216 of FIG. 2. As a result, each finger 310 of FIG. 3 will be able to conduct more current than each finger 210 of FIG. 2. As such, a gated diode having the architecture of the gated diode 300 of FIG. 3 can be implemented with fewer fingers and therefore a smaller IC footprint than a corresponding gated diode having the architecture of the gated diode 200 of FIG. 2, while supporting an equivalent maximum current level.

Figure 5A:
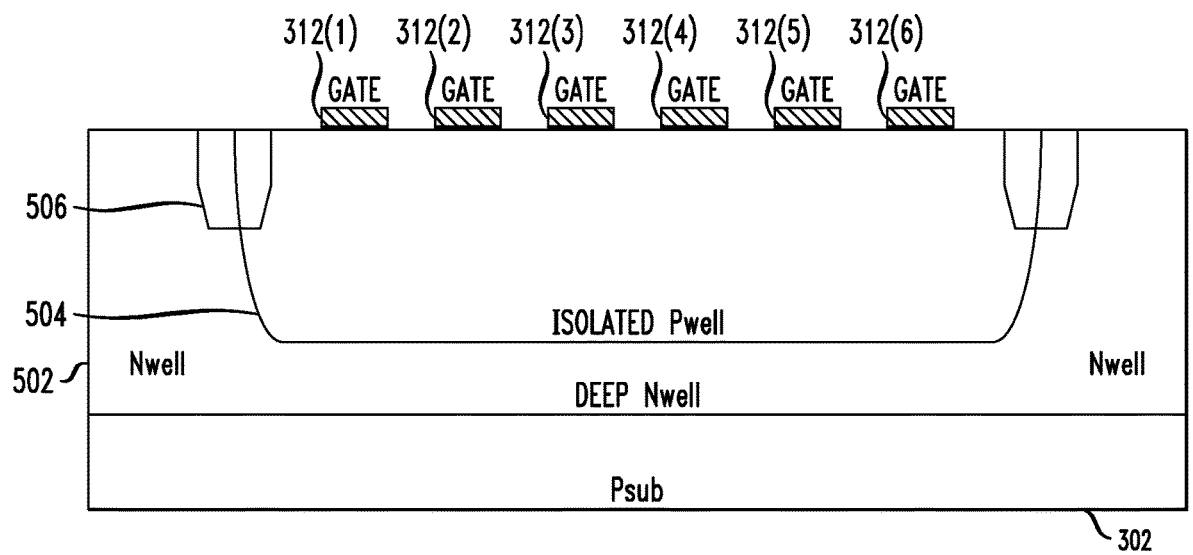
FIGS. 5A-5C are cross-sectional side views of the portion of the semiconductor substrate corresponding to the gated diode of FIG. 3 at three different stages during the IC fabrication process for the gated diode of FIG. 3.
Figure 5B:
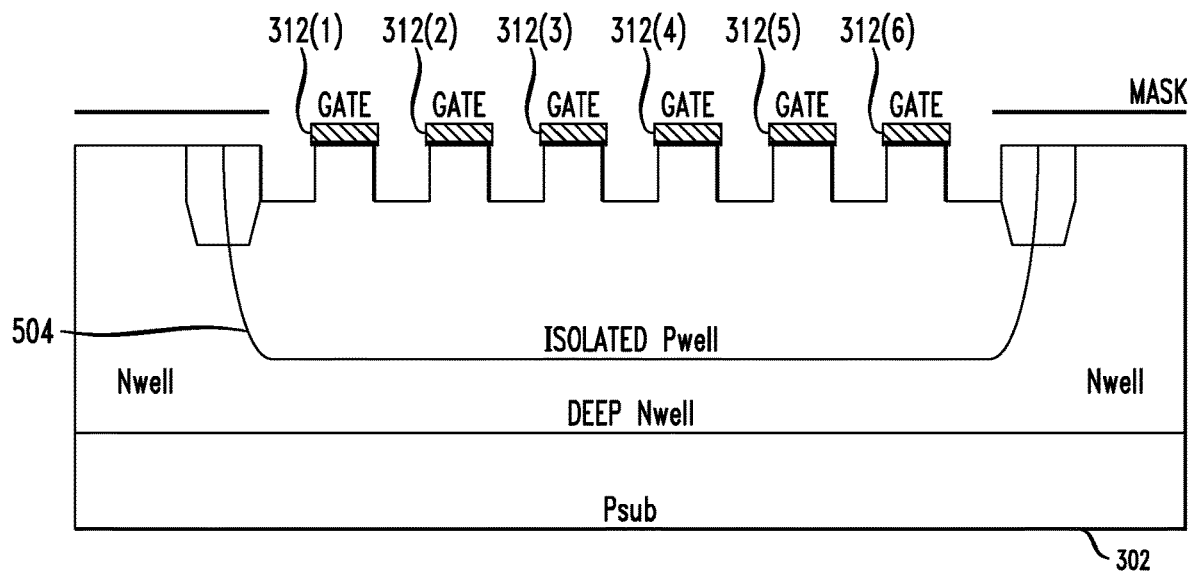
Figure 5C:
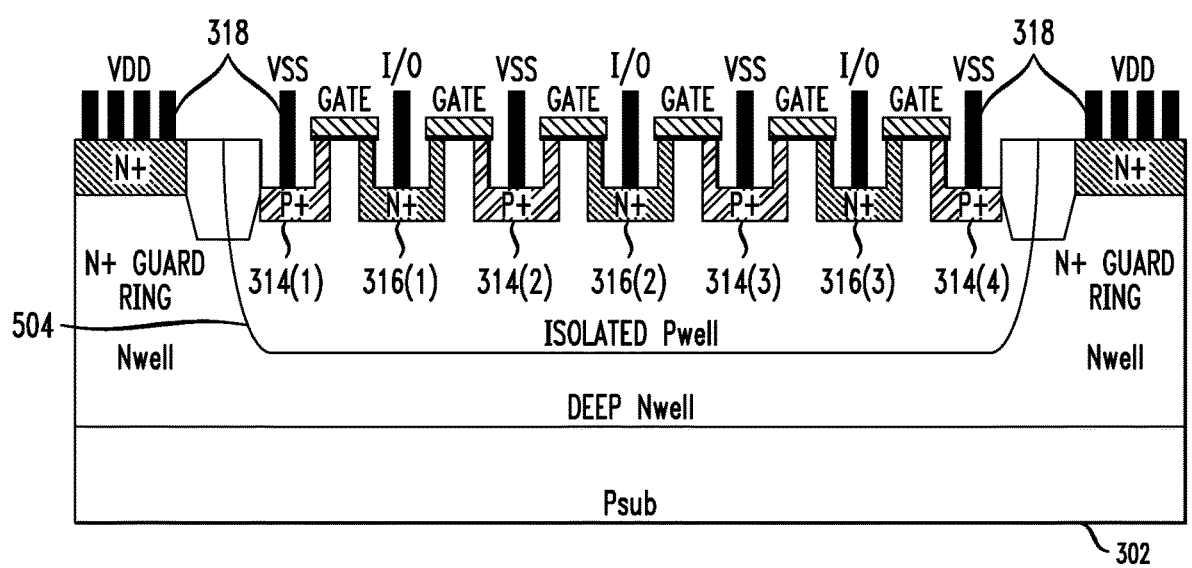

FIGS. 5A-5C are cross-sectional side views of the portion of the semiconductor substrate 302 corresponding to the gated diode 300 of FIG. 3 at three different stages during the IC fabrication process for the gated diode 300.

In particular, FIG. 5A shows the semiconductor substrate 302 after the following fabrication steps have been performed:

Selectively apply n-type dopant to form the deep Nwell 502 in the p-type substrate 302;
Selectively apply p-type dopant to form the isolated Pwell 504 above the deep Nwell 502;
Selectively apply n-type dopant to form the N+ guard ring 506 surrounding the isolated Pwell 504; and
Form the six gates 312(1)-312(6) on top of the isolated Pwell 504.

Those skilled in the art will understand that there are different possible techniques for performing each of these different fabrication steps. Typical techniques involve photolithography in which selective regions of the substrate 302 are masked in order to form the corresponding features. One possible technique for forming the gates 312 involves growing uniform dielectric layer and then a polysilicon or metal conductive layer on top of the substrate 302, selectively masking regions of the dielectric and conductive layers corresponding to the gates 312, and then (wet or dry) etching away the conductive material and the dielectric material from the unmasked regions.

FIG. 5B shows the semiconductor substrate 302 after seven trenches ED(1)-ED(7) have been formed in the substrate 302 of FIG. 5A. In one possible technique, with the mask material used to form the six gates 312(1)-312(6) kept in place (and after additional mask material is added over the exposed top surfaces of the deep N well 502 and the N+ guard ring 506), material from the isolated P well 504 is (wet or dry) etched away to form the trenches ED. Note that the depth of the trenches ED is substantially equal to the height T2 of the annular side walls 420 and 440 of the P+ and N+ diffusions 314 and 316 of FIGS. 3 and 4.

FIG. 5C shows the semiconductor substrate 302 after the four P+ diffusions 314(1)-314(4) and the three N+ diffusions 316(1)-316(3) have been formed in the substrate 302 of FIG. 5B. In one possible technique, the P+ and N+ diffusions 314 and 316 are formed using the following fabrication steps:

Selectively apply p-type dopant to form the four P+ diffusions 314(1)-314(4) in the isolated P well 504;
Selectively apply n-type dopant to form the three N+ diffusions 316(1)-316(3) in the isolated P well 504; and
Deposit dielectric over silicon and gate (not shown in figure) and form the contacts 318.

In one possible technique, with the mask material used to form the seven trenches ED(1)-ED(7) kept in place and after additional mask material is added over the trenches ED(2), ED(4), and ED(6), the p-type dopant is applied to the four unmasked trenches ED(1), ED(3), ED(5), and ED(7) to form the four P+ diffusions 314(1)-314(4). Then, with the mask material removed from over the trenches ED(2), ED(4), and ED(6) and after additional mask material is added over the four P+ diffusions 314(1)-314(4), the n-type dopant is applied to the three unmasked trenches ED(2), ED(4), and ED(6) to form the three N+ diffusions 316(1)-316(3). Note that, in an alternative technique, the N+ diffusions 316 are formed before the P+ diffusions 314.

As represented in FIG. 5C, when the p-type dopant is added to form the P+ diffusions 314, the p-type dopant becomes implanted into the side walls of the corresponding trenches ED as well as into the bottoms of those trenches ED to produce the P+ diffusions 314 having both base regions (such as the base region 410) and annular side regions (such as the annular side region 420). Similarly, when the n-type dopant is added to form the N+ diffusions 316, the n-type dopant becomes implanted into the side walls of the corresponding trenches ED as well as into the bottoms of those trenches ED to produce the N+ diffusions 316 having both base regions (such as the base region 430) and annular side regions (such as the annular side region 440).

In one possible implementation based on 40-nanometer IC technology, the gated diode implemented for the first diode 112 of FIG. 1 using the architecture of FIG. 2 has 50 fingers that are analogous to the fingers 310 of FIG. 3, each finger having a gate length of about 0.27 um, a gate-to-gate distance of about 0.36 um, a gate elevation (i.e., T2 of FIG. 4) of about 1000 A, and a base thickness (i.e., T1 of FIG. 4) of about 1000 A. Such a gated diode can be implemented with a footprint that is about 35% smaller than the footprint of a gated diode implemented using the conventional architecture of FIG. 2 to support an equivalent maximum current.

FIGS. 5A-5C represent one possible technique for fabricating the gated diode 300 of FIG. 3 having elevated gates 312 and P+ and N+ diffusions 314 and 316 having both base regions and annular side regions. In the technique of FIGS. 5A-5C, the elevated gates 312 are formed by etching away substrate material to form the trenches ED after applying the dielectric gate material. In alternative techniques that would be understood by those skilled in the art, analogous elevated gates can be formed by selectively growing the underlying substrate material to form the trenches ED before applying the dielectric gate material.

Figure 6:
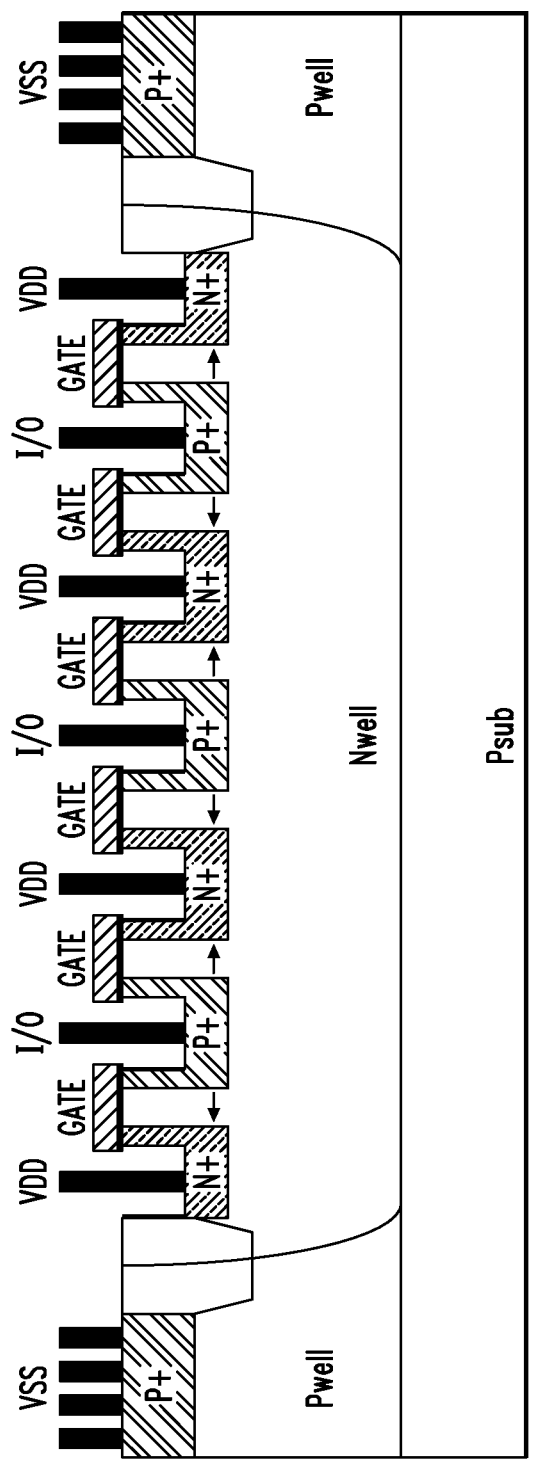
FIG. 6 is a cross-sectional side view of the region of the semiconductor substrate of FIG. 3 corresponding to a P+/N well gated diode according to one embodiment of the present invention.

FIG. 6 is a cross-sectional side view of the region of the semiconductor substrate corresponding to a P+/N well gated diode 600 that can be used to implement the second diode 114 of FIG. 1, according to one embodiment of the invention. Those skilled in the art will understand that the gated diode 600 can be fabricated using processing steps that are analogous to those used to form the gated diode 300 of FIG. 3.

It should be apparent to those skilled in the art that the present invention may be embodied in many other specific forms without departing from the spirit or scope of the invention. Particularly, it should be understood that the present invention may be embodied in the following forms.

Although the invention has been described in the context of the gated diode 300 of FIG. 3 having six fingers 310(1)-310(6), those skilled in the art will understand that gated diodes of the invention may have any suitable number of one or more fingers.

Although the invention has been described in the context of the gated diode 300 formed on the p-type semiconductor substrate 302 having the deep N well 502 and the isolated P well 504, those skilled in the art will understand that gated diodes of the invention can be implemented on other suitable types and configurations of semiconductor substrates having different well structures. For example, in some alternative implementations, each P+ diffusion 314 is implemented within a p-type lightly doped drain (PLDD) region and/or each N+ diffusion 316 is implemented within an n-type LDD (NLDD) region.

The semiconductor substrate 302 may be of any suitable semiconductor material such as but not limited to silicon, germanium, silicon-on-insulator (SOI), and GaAs.

Although the invention has been described in the context of gated diodes for ESD-protection circuitry, those skilled in the art will understand that gated diodes of the invention can also be used in other types of integrated circuitry.

Signals and corresponding terminals, nodes, ports, or paths may be referred to by the same name and are interchangeable for purposes here.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The present examples and embodiments are to be considered as illustrative and not restrictive, and the invention is not to be limited to the details given herein, but may be modified within the scope and equivalence of the appended claims.

The invention claimed is:

1. A method for fabricating a first gated diode of an integrated circuit, the method comprising:
    forming one or more diode fingers of the first gated diode on a substrate, each diode finger comprising an elevated gate and a p-type diffusion and an n-type diffusion on opposing sides of the elevated gate, wherein:
        the p-type diffusion comprises a p-type base region and a p-type annular side region between the p-type base region and the elevated gate; and
        the n-type diffusion comprises an n-type base region and an n-type annular side region between the n-type base region and the elevated gate; and
    forming at least one first contact connected to each of the elevated gate, the p-type diffusion, and the n-type diffusion of each diode finger of the first gated diode;
    wherein each diode finger is formed by:
        applying gate material to the substrate corresponding to the elevated gate;
        removing material from the substrate to form first and second trenches on opposing sides of the gate material to form the elevated gate;
        applying a p-type dopant to the first trench to form the p-type diffusion; and
        applying an n-type dopant to the second trench to form the n-type diffusion.

2. The method of claim 1, further comprising:
forming one or more diode fingers of a second gated diode on the substrate, each diode finger of the second gated diode comprising an elevated gate and a p-type diffusion and an n-type diffusion on opposing sides of the elevated gate of the second gated diode, wherein:
    the p-type diffusion of the second gated diode comprises a p-type base region and a p-type annular side region between the p-type base region and the elevated gate; and
    the n-type diffusion of the second gated diode comprises an n-type base region and an n-type annular side region between the n-type base region and the elevated gate; and
forming at least one second contact connected to each of the elevated gate, the p-type diffusion, and the n-type diffusion of each diode finger of the second gated diode.

3. The method of claim 2, wherein:
the integrated circuit further comprises a high supply voltage (VDD) node, a low supply voltage (VSS) node, an input/output (I/O) pin, and protected circuitry connected to the VDD node, the VSS node, and the I/O pin;
the first and second gated diodes are part of ESD-protection circuitry of the integrated circuit;
the first gated diode is connected between the I/O pin and the VDD node and configured to protect the protected circuitry from an over voltage applied to the I/O pin by shunting current from the I/O pin to the VDD node by way of the first gated diode; and
the second gated diode is connected between the I/O pin and the VSS node and configured to protect the protected circuitry from an under voltage applied to the I/O pin by shunting current from the VSS node to the I/O pin by way of the second gated diode.

* * * * *